(12) United States Patent
Lee

(10) Patent No.: US 8,699,276 B2
(45) Date of Patent: Apr. 15, 2014

(54) DATA TRANSMISSION CIRCUITS AND SEMICONDUCTOR MEMORY DEVICES INCLUDING THE SAME

(75) Inventor: Kyong Ha Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 50 days.

(21) Appl. No.: 13/591,306

(22) Filed: Aug. 22, 2012

(65) Prior Publication Data
US 2013/0223160 A1    Aug. 29, 2013

(30) Foreign Application Priority Data
Feb. 24, 2012   (KR) .......................... 10-2012-0019325

(51) Int. Cl.
*G11C 7/10* (2006.01)
(52) U.S. Cl.
USPC ...................................... 365/189.02; 365/193
(58) Field of Classification Search
USPC .................................. 365/189.02, 193, 233.1
See application file for complete search history.

(56) References Cited

U.S. PATENT DOCUMENTS 7,411,839 B2 *  8/2008  Cha ........................... 365/189.05
8,284,617 B2 * 10/2012  Johnson .................... 365/189.02

* cited by examiner

*Primary Examiner* — Huan Hoang
(74) *Attorney, Agent, or Firm* — William Park & Associates Patent Ltd.

(57) ABSTRACT

A semiconductor memory device including a first edge region for receiving a write command through a first pad portion to generate a column enable signal used in creation of a column selection signal; a second edge region including a data transmission control circuit capable of receiving an input data and a data strobe signal through a second pad portion and capable of receiving an address signal from the first pad portion to generate and output transmission data, the data transmission control circuit capable of outputting the column enable signal transmitted from the first edge region; and a core region including a column control portion that is capable of processing the transmission data in response to the column enable signal outputted from the second edge region to send the transmission data to bit lines electrically connected to memory cells.

18 Claims, 5 Drawing Sheets

DATA TRANSMISSION CIRCUITS AND SEMICONDUCTOR MEMORY DEVICES INCLUDING THE SAME

CROSS-REFERENCE TO RELATED APPLICATION

The present application claims priority under 35 U.S.C 119(a) to Korean Application No. 10-2012-0019325, filed on Feb. 24, 2012, in the Korean Intellectual Property Office, which is incorporated herein by reference in its entirety.

BACKGROUND

A semiconductor memory device may include a pad portion through which commands and addresses are received for input and output operations of data. The pad portion may be disposed at a central region or an edge region of the semiconductor device when viewed from a plan view. Recently, in the semiconductor memory device employed in mobile systems, the commands and the addresses may be received through a first pad portion located at a first edge region of a semiconductor substrate and the data and data strobe signals are received through a second pad portion located at a second edge region of the semiconductor substrate. The first edge region may be spaced apart from the second edge region.

FIG. 1 is a block diagram illustrating a configuration of a typical semiconductor memory device.

As illustrated in FIG. 1, the typical semiconductor memory device may be configured to include a first edge region 41, a second edge region 42 and a core region 43. The first edge region 41 may include a column enable signal generator 412 for generating a column enable signal YI_EN that has pulses for executing a column operation in a write mode in response to a write command WT_CMD inputted through a first pad portion 411. The second edge region 42 may include a data input portion 422 for receiving data DIN generated in synchronization with a data strobe signal DQS outputted from a second pad portion 421 to transmit the data DIN to the core region 43. The core region 43 may include a column control portion 431 for controlling an operation that stores the data DIN in memory cells in response to the column enable signal YI_EN in a write mode. The column enable signal YI_EN may be enabled to generate a column selection signal for controlling an operation that transmits data on local input/output lines to bit lines electrically connected to the memory cells.

The typical semiconductor memory device described above may store the data DIN outputted from the second edge region 42 in the memory cells disposed in the core region 43 in response to the column enable signal YI_EN in a write mode.

In the event that the column control portion 431 is disposed to be closer to the first edge region 41 than a distance between the column control portion 431 and the second edge region 42, the column enable signal YI_EN transmitted through a first path P1 may reach the column control portion 431 before the data DIN transmitted through a second path P2 reaches the column control portion 431. That is, signals of the local input/output lines may be transmitted to the bit lines before the data DIN are transmitted to the local input/output lines. Accordingly, the data DIN and the column enable signal YI_EN can be synchronously inputted to the column control portion 431 by appropriately delaying the column enable signal YI_EN. However, in such a case, there may be some difficulties in adjusting the timings of the data DIN and the column enable signal YI_EN according to the position of the column control portion 431.

SUMMARY

Various embodiments may be directed to data transmission circuits and semiconductor memory devices including the same.

According to various embodiments, a semiconductor memory device includes a first edge region for receiving a write command through a first pad portion to generate a column enable signal used in creation of a column selection signal; a second edge region including a data transmission control circuit capable of receiving an input data and a data strobe signal through a second pad portion and capable of receiving an address signal from the first pad portion to generate and output transmission data, the data transmission control circuit capable of outputting the column enable signal transmitted from the first edge region; and a core region including a column control portion that is capable of processing the transmission data in response to the column enable signal outputted from the second edge region to send the transmission data to bit lines electrically connected to memory cells.

In an embodiment, a data transmission control circuit includes a first pulse extraction portion for extracting a pulse included in a data strobe clock signal and for outputting the extracted pulse of the data strobe clock signal as a latch pulse; a second pulse extraction portion for extracting a pulse included in a column enable signal used in creation of a column selection signal and for outputting the extracted pulse of the column enable signal as an output pulse; and a latch portion for latching internal data in response to the latch pulse and for outputting the latched internal data in response to the output pulse.

In an embodiment, a data transmission control circuit includes a first pulse extraction portion for extracting a first pulse and a second pulse included in a data strobe clock signal to output first and second latch pulses corresponding to the first and second pulses of the data strobe clock signal respectively; a second pulse extraction portion for extracting a first pulse and a second pulse included in a column enable signal used in creation of a column selection signal to generate first and second output pulses corresponding to the first and second pulses of the column enable signal respectively; a first latch portion for latching a first internal data in response to the first latch pulse and outputting the latched first internal data in response to the first output pulse as latch data; and a second latch portion for latching a second internal data in response to the second latch pulse and outputting the latched second internal data in response to the second output pulse as the latch data.

BRIEF DESCRIPTION OF THE DRAWINGS

Embodiments of the inventive concept will become more apparent in view of the attached drawings and accompanying

DETAILED DESCRIPTION

Figure 1:
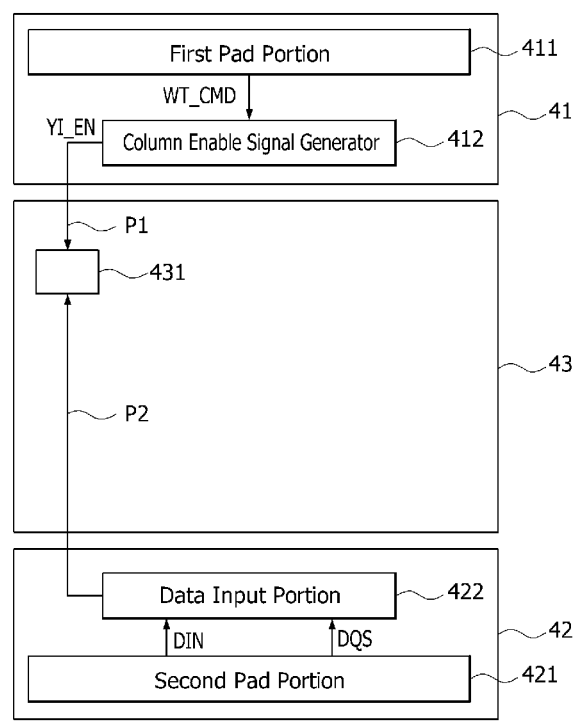
FIG. 1 is a block diagram illustrating a configuration of a typical semiconductor memory device.

Embodiments are described below with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough and complete, and will convey the scope of the disclosure to those skilled in the art. In the drawings, the same reference numerals or the same reference designators denote the same elements throughout the specification.

The terminology used herein is for the purpose of describing particular embodiments only and is not intended to limit the embodiments. As used herein, the singular forms "a," "an," and "the" are intended to include the plural forms as well, unless the context clearly indicates otherwise. It will be further understood that the terms "has", "having", "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
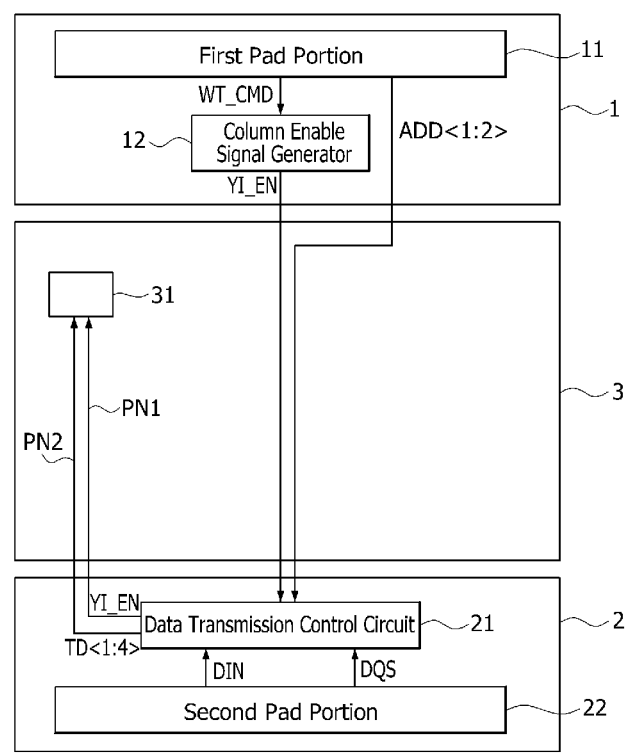
FIG. 2 is a block diagram illustrating a configuration of a semiconductor memory device according to an embodiment.

FIG. 2 is a block diagram illustrating an example of a configuration of a semiconductor memory device according to an embodiment.

As illustrated in FIG. 2, a semiconductor memory device according to the present embodiment may be configured to include a first edge region 1, a second edge region 2 and a core region 3. The first edge region 1 may include a first pad portion 11 and may output a write command signal WT_CMD and an address signal ADD<1:2>, and a column enable signal generator 12 for generating a column enable signal YI_EN that may be enabled to execute a column operation for a write operation in response to the write command signal WT_CMD. The second edge region 2 may include a second pad portion 22 and may output input data DIN and a data strobe signal DQS, and a data transmission control circuit 21 for receiving the input data DIN in synchronization with the data strobe signal DQS to generate transmission data TD<1:4> in response to the column enable signal YI_EN. The core region 3 may include a column control portion 31 for receiving the transmission data TD<1:4> through a second path PN2 and for receiving the column enable signal YI_EN through a first path PN1 to store the transmission data TD<1:4> in memory cells during a write operation.

The column enable signal generator 12 may generate the column enable signal YI_EN including pulses for executing the column operation during a write operation. In the event that a first write operation and a second write operation are sequentially executed according to the write command signal WT_CMD, the column enable signal generator 12 may generate the column enable signal YI_EN including first pulses for executing a column operation during a first write operation and second pulses for executing a column operation during a second write operation.

Figure 3:
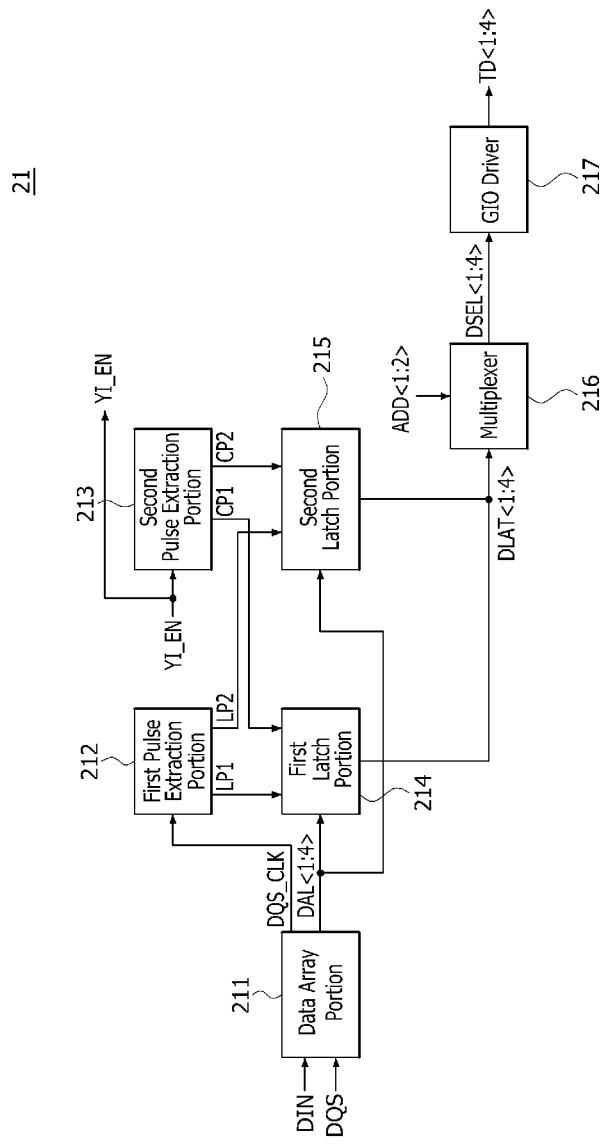
FIG. 3 is a block diagram illustrating an example of a data transmission circuit included in a semiconductor memory device illustrated in FIG. 2.

FIG. 3 is a block diagram illustrating an example of a data transmission circuit included in a semiconductor memory device illustrated in FIG. 2.

As illustrated in FIG. 3, a data transmission circuit 21, i.e., a data transmission control circuit may be configured to include a data array portion 211, a first pulse extraction portion 212, a second pulse extraction portion 213, a first latch portion 214, a second latch portion 215, a multiplexer 216, and a GIO driver 217.

The data array portion 211 may array the input data DIN in response to the data strobe signal DQS, thereby generating internal data DAL<1:4>. A semiconductor memory device according to the present embodiment may execute a write operation in the event that a burst length is set to a value of 4. Thus, the data array portion 211 may synchronize four-bit input data DIN, which are serially inputted during each write operation executed according to the write command WT_CMD, with the data strobe signal DQS, thereby arraying the four-bit input data DIN in parallel and generating the internal data DAL<1:4>. The data array portion 211 may generate a data strobe clock signal DQS_CLK including pulses occurred whenever generation of the internal data DAL<1:4> for the write operation ends. In the event that the first write operation and the second write operation are sequentially executed according to the write command WT_CMD, the data array portion 211 may generate the data strobe clock signal DQS_CLK including first pulses according to the first write operation and second pulses according to the second write operation.

The first pulse extraction portion 212 may extract pulses included in the data strobe clock signal DQS_CLK to generate a first latch pulse LP1 and a second latch pulse LP2. Additionally, when the first write operation and the second write operation are sequentially executed according to the write command WT_CMD, the first pulse extraction portion 212 may output a first pulse of the data strobe clock signal DQS_CLK as the first latch pulse LP1 and may output a second pulse of the data strobe clock signal DQS_CLK as the second latch pulse LP2.

The second pulse extraction portion 213 may extract pulses included in the column enable signal YI_EN to generate a first output pulse CP1 and a second output pulse CP2. Additionally, when the first write operation and the second write operation are sequentially executed according to the write command WT_CMD, the second pulse extraction portion 213 may output a first pulse of the column enable signal YI_EN as the first output pulse CP1 and may output a second pulse of the column enable signal YI_EN as the second output pulse CP2.

The first latch portion 214 may latch the internal data DAL<1:4> generated according to the first write operation in synchronization with the first latch pulse LP1. The second latch portion 215 may latch the internal data DAL<1:4> generated according to the second write operation in synchronization with the second latch pulse LP2. The first latch portion 214 may output the latched internal data DAL<1:4> in synchronization with the first output pulse CP1 as latch data DLAT<1:4>. The second latch portion 215 may output the latched internal data DAL<1:4> in synchronization with the second output pulse CP2 as latch data DLAT<1:4>.

The multiplexer 216 may multiplex the latch data DLAT<1:4> in response to the address signal ADD<1:2> to generate selection data DSEL<1:4>. The selection data DSEL<1:4> may include information on positions of memory cells of the core region 3, in which data are stored, according to the address signal ADD<1:2>.

The GIO driver 217 may receive the selection data DSEL<1:4> to generate transmission data TD<1:4>. The GIO driver 217 may send the transmission data TD<1:4> to the column control portion 31 controlling the column operation of the memory cells in which data are stored according to the information included in the selection data DSEL<1:4>.

Figure 4:
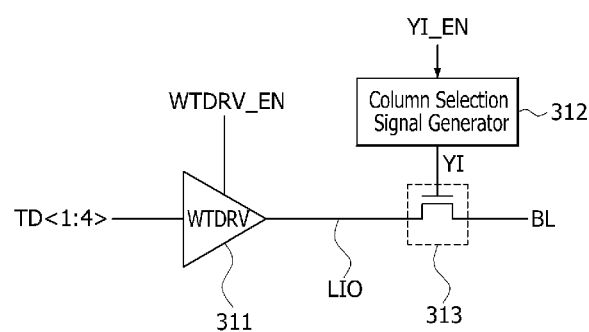
FIG. 4 is a block diagram illustrating an example of a column control portion included in a semiconductor memory device illustrated in FIG. 2.

FIG. 4 is a block diagram illustrating an example of the column control portion 31 included in a semiconductor memory device Illustrated in FIG. 2.

As illustrated in FIG. 4, the column control portion 31 may be configured to include a write driver 311, a column selection signal generator 312, and a transfer element 313. The write driver 311 may receive the transmission data TD<1:4> in response to a write driver enable signal WTDRV_EN to send out an output signal through a local input/output line LIO. The column selection signal generator 312 may generate a column selection signal YI enabled to have a logic high voltage level whenever a pulse of the column enable signal YI_EN is inputted. The transfer element 313, for example, a transfer switching element may be turned on in response to the column selection signal YI to transmit the data on the local input/output line LIO to bit lines BL electrically connected to the memory cells.

The write operation of the semiconductor memory device set forth above will be described with reference to FIG. 5.

Figure 5:
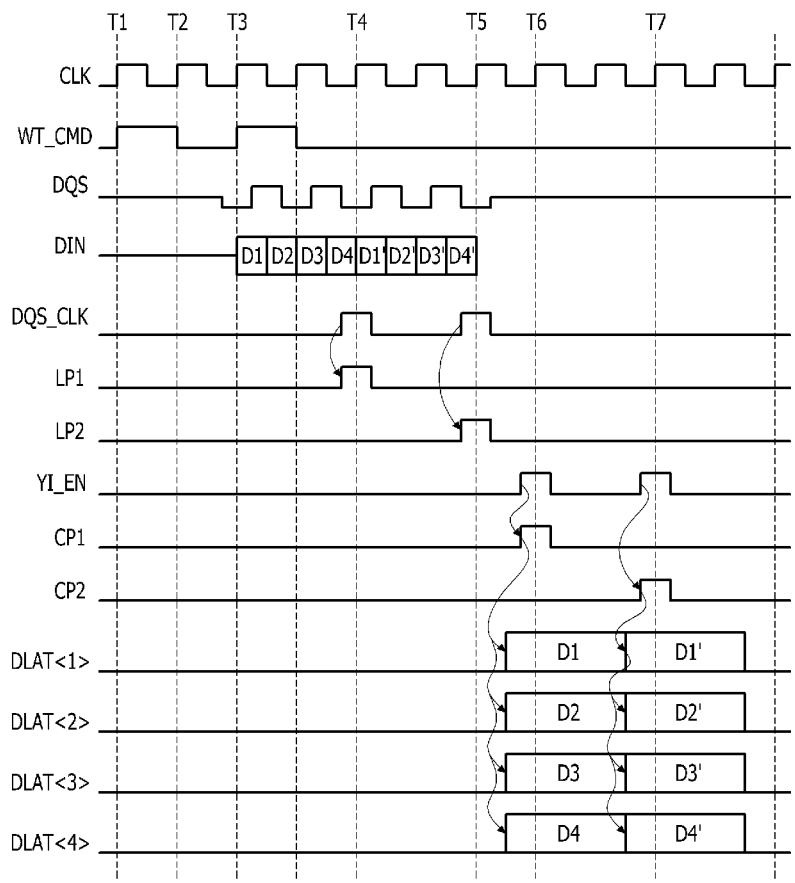
FIG. 5 is a timing diagram illustrating an example of a writing operation of a semiconductor memory device illustrated in FIG. 2.

FIG. 5 is a timing diagram illustrating an example of the write operation of the semiconductor memory device shown in FIG. 2. It may be assumed here that the first write operation and the second write operation are sequentially executed according to the write command WT_CMD when a write latency is set to a value of 1 and a burst length is set to a value of 4. It may also be assumed that a second time is T2.

First, if the first write operation is executed by the write command WT_CMD inputted at a first time T1, the data array portion 211 may array in parallel the four-bit input data DIN serially inputted during a time period between a third time T3 and a fourth time T4 for the first write operation to generate the internal data DAL<1:4>. In this case, the data array portion 211 may generate a first pulse of the data strobe clock signal DQS_CLK in synchronization with the fourth time T4 when generation of the internal data DAL<1:4> according to the first write operation ends. Further, if the second write operation is executed by the write command WT_CMD inputted at the third time T3, the data array portion 211 may array in parallel the four-bit input data DIN serially inputted during a time period between the fourth time T4 and a fifth time T5 for the second write operation to generate the internal data DAL<1:4>. In this case, the data array portion 211 may generate a second pulse of the data strobe clock signal DQS_CLK in synchronization with the fifth time T5 when generation of the internal data DAL<1:4> according to the second write operation ends.

The first pulse extraction portion 212 may output the first pulse of the data strobe clock signal DQS_CLK generated in synchronization with the fourth time T4 as a first latch pulse LP1 and may output the second pulse of the data strobe clock signal DQS_CLK generated in synchronization with the fifth time T5 as a second latch pulse LP2. At this time, the first latch portion 214 may latch the internal data DAL<1:4> generated according to the first write operation in synchronization with the first latch pulse LP1 at the fourth time T4. In addition, the second latch portion 215 may latch the internal data DAL<1:4> generated according to the second write operation in synchronization with the second latch pulse LP2 at the fifth time T5.

The column enable signal generator 12 may generate a first pulse of the column enable signal YI_EN in synchronization with a sixth time T6 for the first write operation and may generate a second pulse of the column enable signal YI_EN in synchronization with a seventh time T7 for the second write operation. However, in some other embodiments, the first pulse and the second pulse of the column enable signal YI_EN may not be generated at the sixth time T6 and the seventh time T7, respectively, but at other times.

The second pulse extraction portion 213 may output the first pulse of the column enable signal YI_EN generated in synchronization with the sixth time T6 as a first output pulse CP1 and may output the second pulse of the column enable signal YI_EN generated in synchronization with the seventh time T7 as a second output pulse CP2. At this time, the first latch portion 214 may output the internal data DAL<1:4> latched according to the first write operation in synchronization with the first output pulse CP1 at the sixth time T6 as the latch data DLAT<1:4>. In addition, the second latch portion 215 may output the internal data DAL<1:4> latched according to the second write operation in synchronization with the second output pulse CP2 at the seventh time T7 as the latch data DLAT<1:4>.

The multiplexer 216 may multiplex the latch data DLAT<1:4> in response to the address signal ADD<1:2> to generate the selection data DSEL<1:4>, and the GIO driver 217 may receive the selection data DSEL<1:4> to generate transmission data TD<1:4>.

The column control portion 31 may execute a column control operation for storing the transmission data TD<1:4> inputted through the second path PN2 in the memory cells in the core region 3 in response to the column enable signal YI_EN inputted through the first path PN1. More specifically, during the first write operation, the transmission data TD<1:4> inputted to the column control portion 31 may be transferred to the local input/output line LIO through the write driver 311, and the data on the local input/output line LIO may be transferred to the bit lines BL by the column selection signal YI enabled to have a logic high voltage level in synchronization with the first pulse of the column enable signal YI_EN and may be stored in the memory cells through the bit lines BL. Further, during the second write operation, the transmission data TD<1:4> inputted to the column control portion 31 may be transferred to the local input/output line LIO through the write driver 311, and the data on the local input/output line LIO may be transferred to the bit lines BL by the column selection signal YI enabled to have a logic high voltage level in synchronization with the second pulse of the column enable signal YI_EN and may be stored in the memory cells through the bit lines BL.

As described above, a semiconductor memory device according to one of the embodiments may generate transmission data TD<1:4> according to pulses of a column enable signal YI_EN, and the column enable signal YI_EN and the transmission data TD<1:4> may be transmitted to a column control portion 31 through a first path PN1 and a second path PN2 having substantially the same length, respectively. Thus, an input timing margin of the column enable signal YI_EN and the transmission data TD<1:4> can be increased regardless of a position of the column control portion 31.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor memory device comprising:
   a first edge region for receiving a write command through a first pad portion to generate a column enable signal used in creation of a column selection signal;
   a second edge region including a data transmission control circuit capable of receiving an input data and a data strobe signal through a second pad portion and capable of receiving an address signal from the first pad portion to generate and output transmission data, the data transmission control circuit capable of outputting the column enable signal transmitted from the first edge region; and
   a core region including a column control portion that is capable of processing the transmission data in response to the column enable signal outputted from the second edge region to send the transmission data to bit lines electrically connected to memory cells.

2. The semiconductor memory device of claim 1, wherein the first edge region is separated from the second edge region by the core region.

3. The semiconductor memory device of claim 1, wherein the first edge region includes:
   the first pad portion capable of outputting the write command and the address signal; and
   a column enable signal generator for generating the column enable signal in response to the write command,
   wherein the column enable signal includes a first pulse used in creation of a column selection signal for a first write operation and a second pulse used in creation of a column selection signal for a second write operation.

4. The semiconductor memory device of claim 3, wherein the second edge region includes:
   the second pad portion capable of outputting the input data and the data strobe signal; and
   a data transmission control circuit for latching first internal data and second internal data generated by arraying the input data in response to the data strobe signal, and for generating the transmission data by outputting the latched first internal data and the latched second internal data in response to the first and second pulses of the column enable signal.

5. The semiconductor memory device of claim 1, wherein the data transmission control circuit includes:
   a first pulse extraction portion for extracting a pulse included in a data strobe clock signal and for outputting the extracted pulse of the data strobe clock signal as a latch pulse;
   a second pulse extraction portion for extracting a pulse included in the column enable signal and for outputting the extracted pulse of the column enable signal as an output pulse; and
   a latch portion for latching internal data in response to the latch pulse and for outputting the latched internal data in response to the output pulse.

6. The semiconductor memory device of claim 5, wherein the data transmission control circuit further includes a data array portion for arraying the input data in response to the data strobe signal to generate the internal data and for generating the data strobe clock signal including a pulse occurring whenever generation of the internal data for a write operation ends.

7. The semiconductor memory device of claim 6, wherein the column selection signal is generated to transmit data on local input/output lines connected to output terminals of a write driver to the bit lines during the write operation.

8. The semiconductor memory device of claim 1, wherein the data transmission control circuit includes:
   a first pulse extraction portion for extracting a first pulse and a second pulse included in a data strobe clock signal to output first and second latch pulses corresponding to the first and second pulses of the data strobe clock signal respectively;
   a second pulse extraction portion for extracting a first pulse and a second pulse included in the column enable signal to generate first and second output pulses corresponding to the first and second pulses of the column enable signal respectively;
   a first latch portion for latching a first internal data in response to the first latch pulse and outputting the latched first internal data in response to the first output pulse as latch data; and
   a second latch portion for latching a second internal data in response to the second latch pulse and outputting the latched second internal data in response to the second output pulse as the latch data.

9. The semiconductor memory device of claim 8, wherein the data transmission control circuit further includes a data array portion for arraying the input data in response to the data strobe signal to generate the first and second internal data and to generate the data strobe clock signal including the first and second pulses,
   wherein the first pulse of the data strobe clock signal is generated when generation of the first internal data for a first write operation ends, and the second pulse of the data strobe clock signal is generated when generation of the second internal data for a second write operation ends.

10. The semiconductor memory device of claim 9, wherein the column selection signal is generated to transmit data on local input/output lines connected to output terminals of a write driver to the bit lines when the first and second operations are sequentially executed.

11. The semiconductor memory device of claim 8, wherein the data transmission control circuit further includes:
   a multiplexer for multiplexing the latch data outputted from the first and second latch portions in response to an address signal to generate selection data; and
   a driver for receiving the selection data to generate the transmission data.

12. A data transmission control circuit, comprising:
   a first pulse extraction portion for extracting a pulse included in a data strobe clock signal and for outputting the extracted pulse of the data strobe clock signal as a latch pulse;

a second pulse extraction portion for extracting a pulse included in a column enable signal used in creation of a column selection signal and for outputting the extracted pulse of the column enable signal as an output pulse; and a latch portion for latching internal data in response to the latch pulse and for outputting the latched internal data in response to the output pulse.

13. The data transmission control circuit of claim 12, further comprising a data array portion for arraying input data in response to a data strobe signal to generate the internal data and for generating the data strobe clock signal including a pulse occurring when generation of the internal data for a write operation ends.

14. The data transmission control circuit of claim 12, wherein the column selection signal is generated to transmit data on local input/output lines connected to output terminals of a write driver to bit lines electrically connected to memory cells during a write operation.

15. A data transmission control circuit, comprising:

a first pulse extraction portion for extracting a first pulse and a second pulse included in a data strobe clock signal to output first and second latch pulses corresponding to the first and second pulses of the data strobe clock signal respectively;

a second pulse extraction portion for extracting a first pulse and a second pulse included in a column enable signal used in creation of a column selection signal to generate first and second output pulses corresponding to the first and second pulses of the column enable signal respectively;

a first latch portion for latching a first internal data in response to the first latch pulse and outputting the latched first internal data in response to the first output pulse as latch data; and a second latch portion for latching a second internal data in response to the second latch pulse and outputting the latched second internal data in response to the second output pulse as the latch data.

16. The data transmission control circuit of claim 15, further comprising a data array portion for arraying input data in response to a data strobe signal to generate the first and second internal data and to generate the data strobe clock signal including the first and second pulses, wherein the first pulse of the data strobe clock signal is generated when generation of the first internal data for a first write operation ends, and the second pulse of the data strobe clock signal is generated when generation of the second internal data for a second write operation ends.

17. The data transmission control circuit of claim 15, wherein the column selection signal is generated to transmit data on local input/output lines connected to output terminals of a write driver to bit lines electrically connected to memory cells when the first and second operations are sequentially executed.

18. The data transmission control circuit of claim 15, further comprising:

a multiplexer for multiplexing the latch data outputted from the first and second latch portions in response to an address signal to generate selection data; and a driver for receiving the selection data to generate transmission data.

\* \* \* \* \*